United States Patent [19]

Gillig

[11] Patent Number: 5,448,763
[45] Date of Patent: Sep. 5, 1995

[54] APPARATUS AND METHOD FOR OPERATING A PHASE LOCKED LOOP FREQUENCY SYNTHESIZER RESPONSIVE TO RADIO FREQUENCY CHANNEL SPACING

[75] Inventor: Steven F. Gillig, Roselle, Ill.

[73] Assignee: Motorola, Schaumburg, Ill.

[21] Appl. No.: 149,677

[22] Filed: Nov. 9, 1993

[51] Int. Cl.⁶ .............................................. H04B 1/40
[52] U.S. Cl. ........................ 455/76; 455/77; 455/260; 455/343; 455/266; 331/17; 331/25
[58] Field of Search ................... 455/76–77, 455/120, 260, 266, 343; 379/59; 331/17, 25; 328/155; 375/81, 120

[56] References Cited

U.S. PATENT DOCUMENTS

| | | | |
|---|---|---|---|
| 4,156,855 | 5/1979 | Crowley | 331/1 A |
| 4,471,328 | 9/1984 | Challen | 455/343 |
| 4,802,235 | 1/1989 | Treatch | 455/77 |
| 4,920,320 | 4/1990 | Matthews | 331/17 |
| 5,008,629 | 4/1991 | Ohba et al. | 328/14 |
| 5,093,632 | 3/1992 | Hietala et al. | 455/76 |
| 5,151,665 | 9/1992 | Wentzler | 331/17 |
| 5,175,729 | 12/1992 | Borras et al. | 455/260 |
| 5,272,452 | 12/1993 | Adachi et al. | 331/17 |

OTHER PUBLICATIONS

Metroka, M. "An Introduction to Narrowband AMPS" *IEEE,* 1991; pp. 1463–1468.

*Primary Examiner*—Edward F. Urban
*Assistant Examiner*—Andrew Faile
*Attorney, Agent, or Firm*—Kevin D. Kaschke

[57] ABSTRACT

An apparatus and method for operating a phase locked loop frequency synthesizer responsive to radio frequency channel spacing. The phase locked loop (PLL) frequency synthesizer (300) tunes a radio frequency transceiver (100) to a radio frequency channel. A processor (110) in the transceiver (100) determines the channel spacing of the radio frequency channels in a portion of a radio frequency band including the radio frequency channel, and controls the PLL frequency synthesizer (300) responsive to the determined channel spacing. The present invention advantageously provides the PLL frequency synthesizer (300) with faster lock time and lower noise.

6 Claims, 5 Drawing Sheets

—PRIOR ART—

-PRIOR ART-

APPARATUS AND METHOD FOR OPERATING A PHASE LOCKED LOOP FREQUENCY SYNTHESIZER RESPONSIVE TO RADIO FREQUENCY CHANNEL SPACING

FIELD OF THE INVENTION

The present invention relates generally to radio communication transceivers and, more particularly, to an apparatus and method for operating a phase locked loop frequency synthesizer responsive to radio frequency channel spacing in a radio communication transceiver.

BACKGROUND OF THE INVENTION

Figure 1:
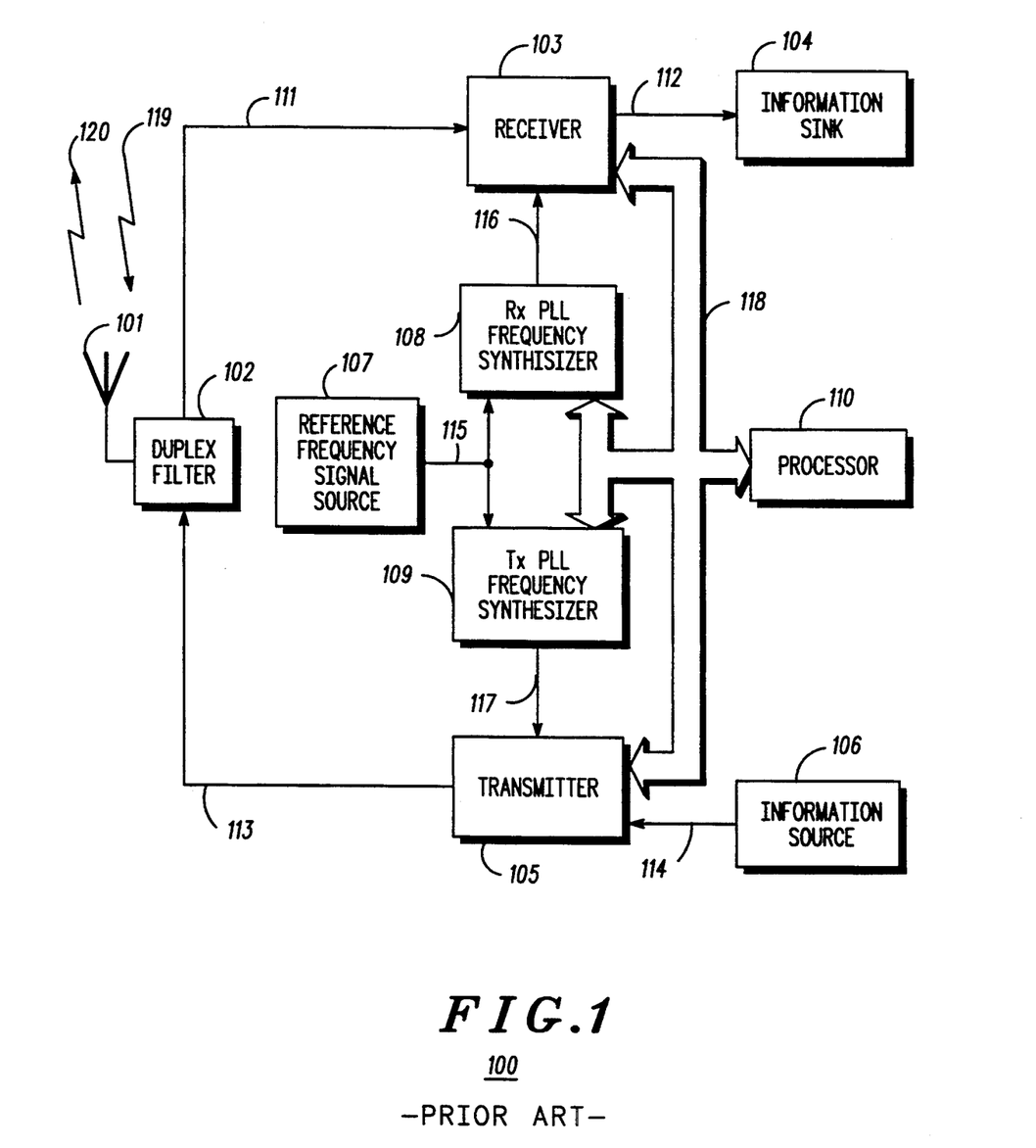
FIG. 1 illustrates a block diagram of a conventional radio communication transceiver.

FIG. 1 illustrates, by example, a block diagram of a conventional radio communication transceiver 100 (hereinafter referred to as "transceiver"). The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 100 is a cellular radiotelephone.

The transceiver 100 of FIG. 1 generally includes an antenna 101, a duplex filter 102, a receiver 103, a transmitter 105, a reference frequency signal source 107, a receive (Rx) phase locked loop (PLL) frequency synthesizer 108, a transmit (Tx) PLL frequency synthesizer 109, a processor 110, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The duplex filter 102 provides frequency selectivity to separate the RF received signal at line 111 and the RF transmit signal at line 113. The receiver 103 is coupled to receive the RF received signal at line 111 and operative to produce a received baseband signal at line 112 for the information sink 104. The reference frequency signal source 107 provides a reference frequency signal at line 115. The Rx PLL frequency synthesizer 108 is coupled to receive the reference frequency signal at line 115 and information on a data bus 118 and operative to produce a receiver tune signal at line 116 to tune the receiver 103 to a particular RF channel. Likewise, the Tx PLL frequency synthesizer 109 is coupled to receive the reference frequency signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 118. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wide band data on the signaling channels, the frequency spacing of the signaling channels is a multiple of the frequency spacing of the voice channels.

In some cellular radiotelephone systems, the transceiver 100 and the base station intermittently transceive information therebetween on the signaling channel. One such system, for example, an interleaved data signaling method to synchronize the intermittent information. In this type of system, keeping the transceiver 100 fully powered during the entire time that the transceiver 100 is tuned to the signaling channel unnecessarily drains the transceiver's battery during those times when the information is not received. Therefore, portions of the transceiver 100 can be powered off to prolong battery life when the transceiver is not transceiving information. Further, portions of the transceiver 100 can be powered off to prolong battery life when the signal quality is good enough such that further repetition of the same information is not needed. Intermittently powering on and off, i.e. enabling and disabling, the transceiver 100 during its receive operation is called discontinuous receive (DRX) mode of operation. In the DRX mode of operation, quickly enabling and disabling the portions of transceiver 100 increases the savings in battery life.

Figure 2:
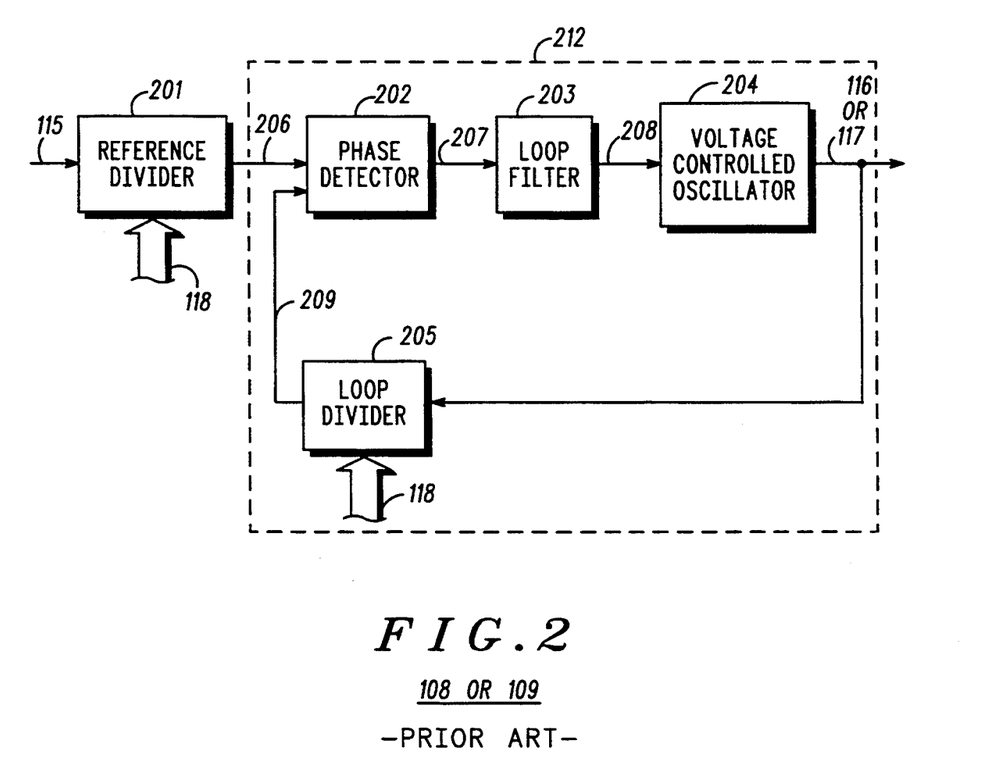
FIG. 2 illustrates a block diagram of a conventional phase locked loop frequency synthesizer for use in the radio communication transceiver of FIG. 1.

FIG. 2 illustrates, by example, a block diagram of a conventional phase locked loop (PLL) frequency synthesizer for use in the transceiver 100 of FIG. 1. The general structure of the PLL frequency synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201, for discussion purposes, and a PLL 212. The PLL 212 generally includes a phase detector 202, a loop filter 203, a voltage controlled oscillator 204, and a loop divider 205. The reference divider 201 receives a reference frequency signal on line 115.

The interconnection of the blocks of the PLL frequency synthesizer 108 or 109 of FIG. 2 is described as follows. The reference divider 201 is coupled to receive the reference signal at line 115 and the data bus 118 and operative to produce a divided reference frequency signal at line 206. The phase detector 202 is coupled to receive a divided reference frequency signal at line 206 and a feedback signal at line 209, and operative to produce a phase error signal at line 207. The loop filter 203 is coupled to receive the phase error signal 207, and operative to produce a filtered signal at line 208. The voltage controlled oscillator 204 is coupled to receive the filtered signal at line 208 and operative to produce an output frequency signal at line 116 or 117. The loop divider 205 is coupled to receive the output frequency signal at line 116 or 117, and operative to produce the feedback signal at line 209. The loop divider 205 and the reference divider 201 are coupled to receive programming information at the data bus 118.

The operation of the PLL frequency synthesizer 108 or 109 of FIG. 2 is described as follows. The PLL 212 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the 212 PLL typically provides a constant phase difference between the reference frequency signal at line 115 and the output frequency signal at line 116 or 117. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL adjusts the frequency of the output frequency signal at line 116 or 117 to drive the phase error at line 207 toward the value of the constant phase difference.

PLL's are characterized by a loop bandwidth. For some applications it is desirable to vary the loop bandwidth of the PLL under certain conditions such as, for example, when the frequency of the reference frequency signal at line 115 changes or when the programmable parameters of the PLL via the data bus 118 changes. Appropriately varying the loop bandwidth advantageously provides shorter lock time, improved noise, and lower spurious signals.

One general problem with varying the loop bandwidth of the PLL 212 includes determining when to vary the loop bandwidth. Determining when to vary the loop bandwidth directly affects the time required for the PLL 212 to reach a desirable locked condition. It is generally desirable for the PLL 212 to reach its locked condition quickly. If the locked condition of the PLL 2 12 is not reached quickly, noise may be generated or information may be lost.

One particular problem in implementing the discontinuous mode in the transceiver 100 is the recovery (relock) time needed by the PLL 212 to re-establish phase and frequency lock of the carrier frequency, particularly if the PLL 212 must cycle rapidly between the enabled and disabled modes in order to provide the maximum current savings. Further, in the discontinuous mode, the relock time of the PLL 212 can be degraded by current leakage on the filtered signal at line 208 which causes the frequency of the VCO 204 to drift during the disabled portion of the discontinuous mode. The PLL 212 does not replenish the charge on the loop filter 203 and compensate for the leakage while it is disabled. The greater the drift, the more the PLL 212 must compensate its frequency, as well as phase, when it is re-enabled and the longer is the relock time.

A solution provided by the prior art to reduce the recovery time in the discontinuous mode has been to use a synchronization scheme, when the PLL frequency synthesizer 108 or 109 is re-enabled, to reduce or eliminate the phase drift that occurred when the PLL frequency synthesizer 108 or 109 was disabled. A disadvantage with this solution is that, while it does correct for the phase drift, the normal operation of the PLL 212 must still correct for the frequency drift which occurs due to real-world leakage on the filtered signal at line 208.

Another particular problem exists in the transceiver 100 employing a PLL frequency synthesizer 108 or 109 which must rapidly tune between channels in a radio frequency band. If the PLL frequency synthesizer 108 or 109 does not have a sufficiently short lock time during a change in output frequency, the transceiver 100 can miss receiving data or produce errors in transmitted data.

One solution provided by the prior art to reduce lock time has been to increase the bandwidth of the PLL 212. The disadvantage of this solution is that it leads to increased spurious signals and noise at the output of VCO 204 because of the reduced filtering of the wider bandwidth.

Another solution provided by the prior art to reduce lock time in the PLL frequency synthesizer 108 or 109 has been to increase the frequency of the divided reference frequency signal 206 to the PLL 212 so as to increase the loop bandwidth of PLL 212. The disadvantage of this solution is two-fold. First, this solution requires a large increase in the frequency of the divided reference frequency 206 to provide a significant increase in the loop bandwidth because the loop bandwidth increases as the square root of M, where M is the increase in the frequency of the divided reference frequency signal 206 to the PLL 212. Second, the PLL 212 locks at a frequency of the output frequency signal 116 or 117 that is near but not precisely at the final desired frequency. The divided reference frequency 206 and the loop bandwidth must then be switched back to their initial values and the PLL 212 must lock to its final desired frequency. Therefore, two locking cycles are needed and that leads to a long lock time.

Accordingly, there is a need for an apparatus and method for operating a phase locked loop frequency synthesizer responsive to radio frequency channel spacing which advantageously provides for faster lock time and lower noise at the output of the PLL frequency synthesizer.

DETAILED DESCRIPTION OF A PREFERRED EMBODIMENT

In accordance with the present invention, the foregoing need is substantially met by an apparatus and method for operating a phase locked loop frequency synthesizer responsive to radio frequency channel spacing. According to the present invention, the channel spacing of the radio frequency channels in a portion of the radio frequency band including the radio frequency channel is determined, and the PLL frequency synthesizer is controlled responsive to the determined channel spacing. The present invention advantageously provides faster lock time and lower noise at the output of the PLL frequency synthesizer.

Figure 3:
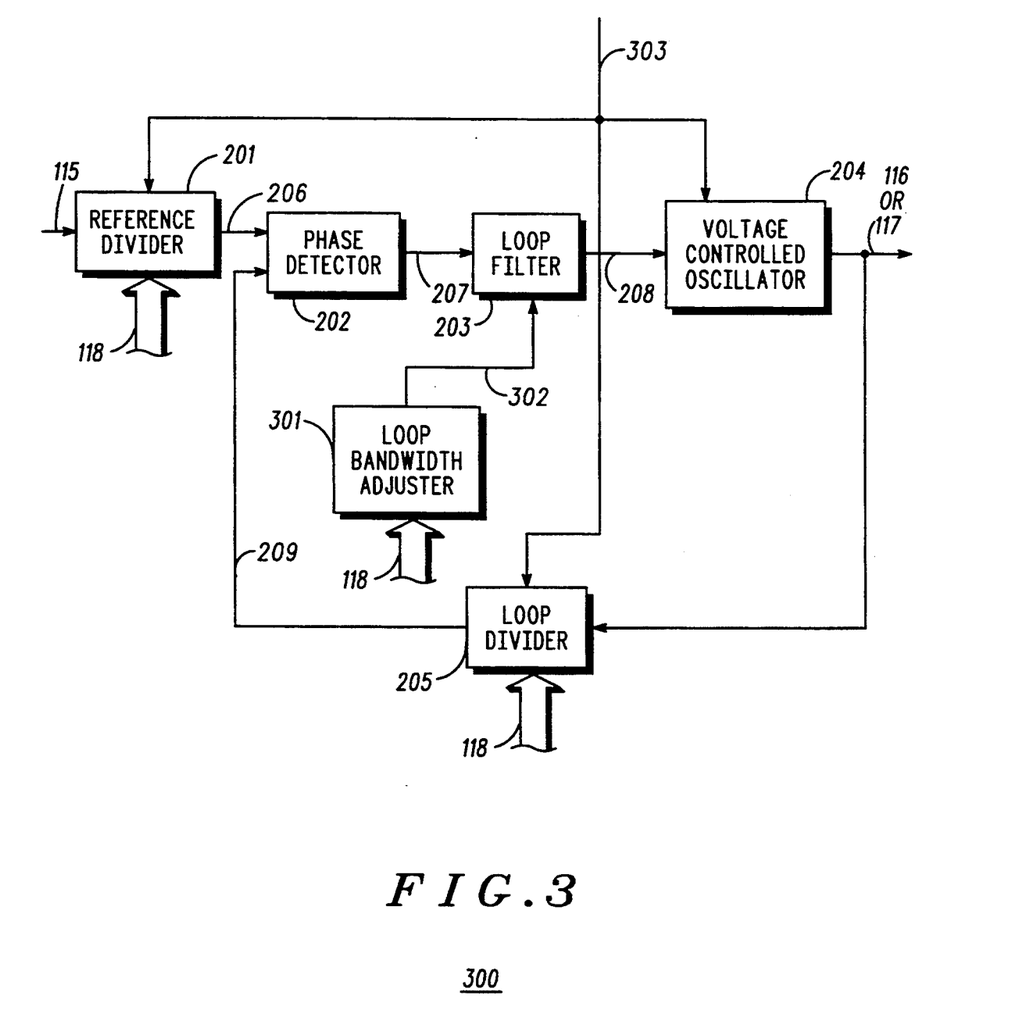
FIG. 3 illustrates a block diagram of a novel phase locked loop frequency synthesizer for use in the radio communication transceiver of FIG. 1 in accordance with the present invention.

The present invention can be more fully described with reference to FIGS. 3–6, wherein FIG. 3 illustrates, by example, a block diagram of a novel phase locked loop (PLL) frequency synthesizer 300 for use in the transceiver 100 of FIG. 1. The general structure and operation of the PLL frequency synthesizer 300 is the same when used as the Rx PLL frequency synthesizer 108 or the Tx PLL frequency synthesizer 109.

The structure and operation of the PLL frequency synthesizer 300 is generally similar to the conventional PLL frequency synthesizer 108 or 109 of FIG. 2, except for the addition of a loop bandwidth adjuster 301 and a control signal at line 303. The loop bandwidth adjuster 301 is programmed with information at the data bus 118 and produces a loop bandwidth adjust signal at line 302 which modifies the loop filter 203 to produce a change in the loop bandwidth of the PLL frequency synthesizer 300. The control signal at line 303 is used to control reference divider 20 1, loop divider 205, and voltage controlled oscillator 204 permitting discontinuous operation of the PLL frequency synthesizer 300.

FIG. 3 illustrates only one of many alternative interconnections, as is known in the art, which can be made between the loop bandwidth adjuster 301 and the PLL frequency synthesizer 300 to control the loop bandwidth. The loop bandwidth adjuster 301 may alternatively be coupled, for example, to the phase detector 202 and the VCO 204, to adjust the loop bandwidth in accordance with well known design techniques. FIG. 3 also illustrates only one of many alternative ways, as is known in the art, in which the blocks of the PLL frequency synthesizer 300 may be coupled to the control signal at line 303 to provide for discontinuous operation. The control signal at line 303 may alternatively be coupled, for example, to the phase detector 202 and loop bandwidth adjuster 301. Alternatively, the control signal at line 303 may be coupled to only one element of the PLL frequency synthesizer 300, for example, the loop divider 205.

The PLL frequency synthesizer 300 may be classified as belonging to one of at least two categories based on the predetermined frequency relationship of the output signal frequency at line 116 or 117 to the frequency of the reference frequency signal at line 115. The first category is classified as an "integer division" PLL frequency synthesizer wherein the relationship between the output frequency signal at line 116 or 117 and reference frequency signal at line 115 is an integer. The second category is classified as a "fractional division" PLL frequency synthesizer in which the relationship between the output frequency signal at line 116 or 117 and reference frequency signal at line 115 is a rational, non-integer number, consisting of an integer and a fraction.

PLL frequency synthesizers are characterized by a resolution. The resolution of the PLL frequency synthesizer 300 is defined as the minimum allowable change, or step, in the frequency of the output signal 116 or 117. The resolution of an integer division PLL frequency synthesizer may be equal to, but is no smaller than, the frequency of the divided reference frequency signal 206. The resolution of a fractional division PLL frequency synthesizer may be equal to, but is no smaller than, a quotient, whose numerator is the frequency of the divided reference frequency signal 206 and whose denominator is the denominator of the fractional part of the value of loop divider 205. The frequency and level of spurious sideband signals on the output signal 116 or 117 are generally directly related to the resolution of the PLL frequency synthesizer 108 or 109.

The resolution of an integer division implementation of the PLL frequency synthesizer 300 can be adjusted by changing the values of the reference divider 201 and the loop divider 205 by reprogramming them via data bus 118. Decreasing the value of both dividers decreases the resolution of the PLL frequency synthesizer 300 and increasing the value of both dividers increases the resolution.

In the preferred embodiment, fractional division is used in the implementation of the PLL frequency synthesizer 300. The resolution of the fractional division implementation of the PLL frequency synthesizer 300 can be adjusted by changing the value of the denominator of the fractional part of the value of loop divider 205. Decreasing the denominator via data bus 118 decreases the resolution of the fractional division implementation of PLL frequency synthesizer 300 and increasing the denominator increases the resolution.

In the preferred embodiment, the transceiver 100 is a cellular radiotelephone operating in a radio frequency band allocated for a particular type of cellular service. In the preferred embodiment, the radio frequency band is used by a typical cellular system, for example, a Narrow Advanced Mobile Phone System (NAMPS). In the NAMPS system, the subscriber unit Tx channels extend from approximately 824 to 849 MHz and the subscriber unit Rx channels extend from approximately 869 to 894 MHz. A portion of these Rx channels from 879.39 to 880.62 MHz is allocated for control channels with 30 kHz wide channel spacing. The channel spacing is defined as a difference in frequency between two adjacent channels of the radio frequency band. The remainder of the channels in the NAMPS radio frequency band are allocated for voice channels with 10 kHz narrow channel spacing. Therefore, the channel spacing varies from 30 kHz to 10 kHz over the NAMPS radio frequency band.

A further example of a radio frequency band having a different channel spacing which may be implemented with the present invention is the Group Special Mobile (GSM) cellular system. In the GSM system, the subscriber unit Tx channels extend from approximately 890 to 915 MHz and the subscriber unit Rx channels extend from approximately 935 to 960 MHz. The GSM channel spacing is 200 kHz. The present invention may be used with a transceiver 100 capable of operating in multiple systems. Therefore, the channel spacing can even vary between the radio frequency bands of each system, for example, between GSM and NAMPS.

According to the preferred embodiment of the present invention, the step of determining the channel spacing in a portion of the radio frequency band including the radio frequency channel is performed by the processor 110. For the transceiver 100 operating in the NAMPS cellular system, if the radio frequency channel to which the transceiver 100 was tuned was in the portion of the band, 879.39 to 880.62 MHz, containing the control channels, the determined channel spacing would be 30 kHz. If the radio frequency channel to which the transceiver 100 was tuned was in the remaining portion of the band containing the voice channels, the determined channel spacing would be 10 kHz.

According to the present invention, the step of determining the channel spacing in a portion of the radio frequency band including the radio frequency channel is used because it indicates what the PLL frequency synthesizer requirements are in the particular portion of the radio frequency band in the particular system in which the transceiver is operating.

According to the preferred embodiment of the present invention, the step of controlling the PLL frequency synthesizer responsive to the determined channel spacing is performed by the processor 110. The determination can be made simply by going to a lookup table or alternately through a calculation or by monitoring data on the radio frequency channel.

An advantage of controlling the PLL frequency synthesizer 300 responsive to the determined channel spacing is that the performance of the PLL frequency synthesizer 300 is controlled according to the configuration of the radio system, and more particularly the radio frequency channel to which the transceiver 100 is tuned. The result is an improvement in performance of the PLL frequency synthesizer 300 over the performance that would be realized if the PLL frequency synthesizer 300 were not controlled responsive to the determined channel spacing.

Figure 4:
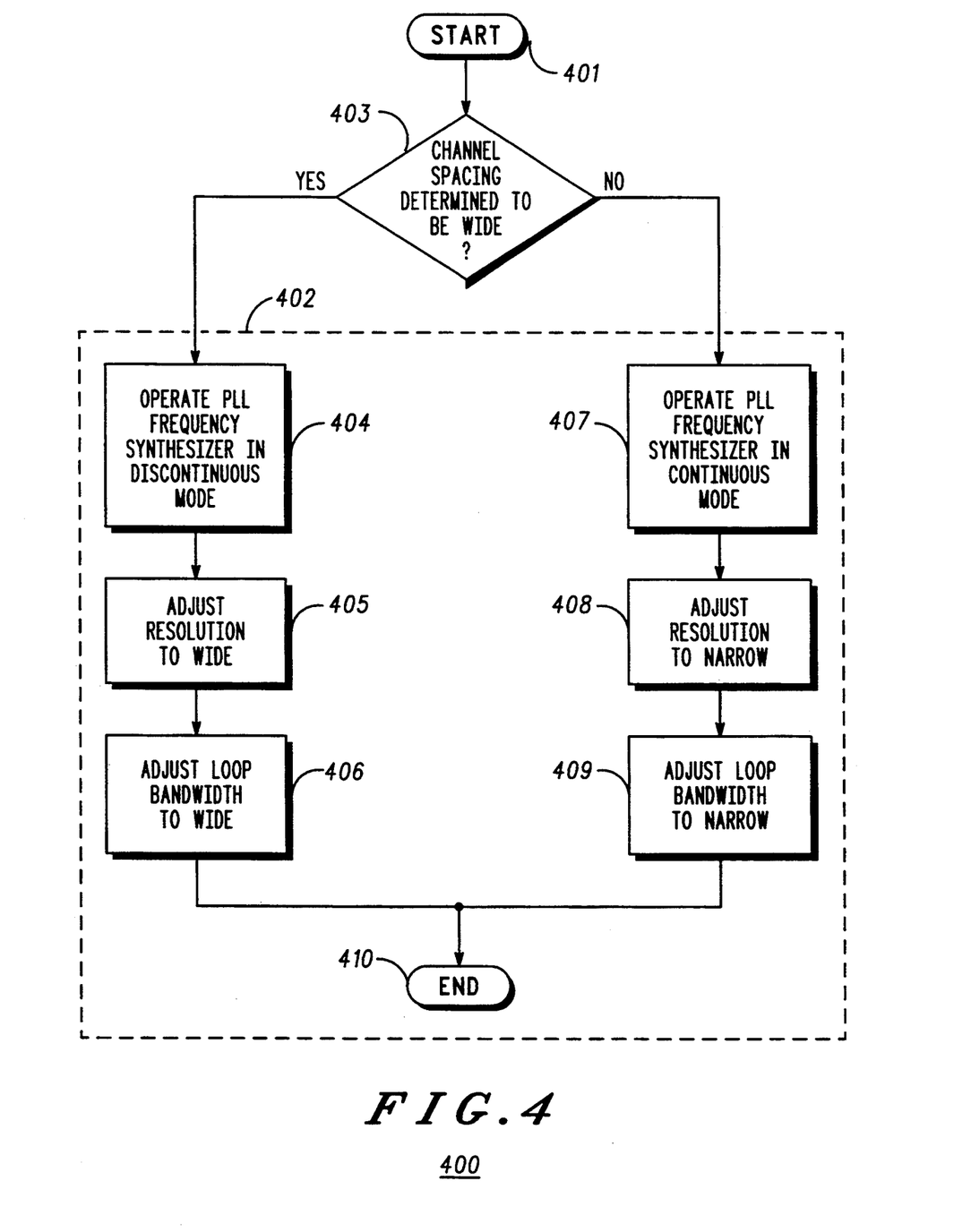
FIG. 4 illustrates a flowchart describing steps for operating the novel phase locked loop frequency synthesizer of FIG. 3 in continuous or discontinuous modes in accordance with the present invention.

FIG. 4 illustrates a flowchart describing steps for operating the novel phase locked loop frequency synthesizer of FIG. 3 in continuous or discontinuous modes in accordance with the present invention. The flowchart starts at step 401. At step 403 the transceiver 100 determines the channel spacing of the radio frequency channels in a portion of the radio frequency band including the radio frequency channel. At step 402, the processor 110 controls the PLL frequency synthesizer responsive to the determined channel spacing. When the channel spacing is determined to be wide at step 403, the PLL frequency synthesizer 300 is operated in a discontinuous mode at step 404; the resolution of the PLL frequency synthesizer 300 is adjusted to be wide at step 405; and the loop bandwidth of the PLL frequency synthesizer 300 is adjusted to be wide at step 406. When the channel spacing is determined to be narrow at step 403, the PLL frequency synthesizer 300 is operated in a continuous mode at step 407; the resolution of the PLL frequency synthesizer 300 is adjusted to be narrow at step 408; and the loop bandwidth of the PLL frequency synthesizer 300 is adjusted to be narrow at step 409.

According to the present invention, the step 403 of determining the channel spacing to be narrow, for example 10 kHz rather than 30 kHz in a NAMPS cellular system, indicates that the transceiver 100 is tuned to a voice channel. The PLL frequency synthesizer 300 is advantageously operated in a continuous mode and has the required resolution for transceiver 100 to be operated on any of the voice channels within the NAMPS radio frequency band.

According to the present invention, if the channel spacing is determined to be wide at step 403, the PLL frequency synthesizer 300 can advantageously be operated in the discontinuous mode, at step 404, to extend battery life. Through the steps of adjusting the resolution to be wide, at step 405, and adjusting the loop bandwidth to be wide, at step 406, the lock time of the PLL frequency synthesizer 108 or 109 can advantageously be shortened and the results are an even greater extension in battery life.

The advantages of the present invention are made clearer by comparing the conventional PLL frequency synthesizer 108 or 109 that is not controlled responsive to the radio frequency channel spacing in a NAMPS cellular system. The conventional PLL frequency synthesizer 108 or 109 would be permanently set to have a resolution of either 10 kHz or 30 kHz. If the resolution of the conventional PLL frequency synthesizer 108 or 109 were set to be 10 kHz, the lock time on the control channels would be slow due to the narrow loop bandwidth required for acceptable spurious sideband levels in the output frequency signal 116 or 117. Data would be lost by a conventional transceiver 100 attempting to operate in the discontinuous Rx (DRX) mode. If operation in the DRX mode were foregone, the battery life of the conventional transceiver 100 would be shortened. Alternatively, if the resolution of the conventional PLL frequency synthesizer 108 or 109 were set to be 30 kHz, the conventional transceiver 100 could only tune to every third voice channel because of the restriction caused by wide resolution and the conventional transceiver 100 would not operate in the NAMPS cellular system.

In contrast to the prior art, the novel PLL frequency synthesizer 300 has a wide bandwidth and wide resolution on the NAMPS control channels for extended battery life from the use of the DRX mode. The novel PLL frequency synthesizer 300 advantageously has a narrow bandwidth and narrow resolution on the NAMPS voice channels so that transceiver 100 can tune to every voice channel. Thus the recent addition of the narrower channel spacing of NAMPS voice channels, 10 kHz versus the 30 kHz spacing of the older Advanced Mobile Phone System (AMPS), has resulted in a need for the improvements which result from controlling the PLL frequency synthesizer 300 in response to the radio frequency channel spacing.

Figure 5:
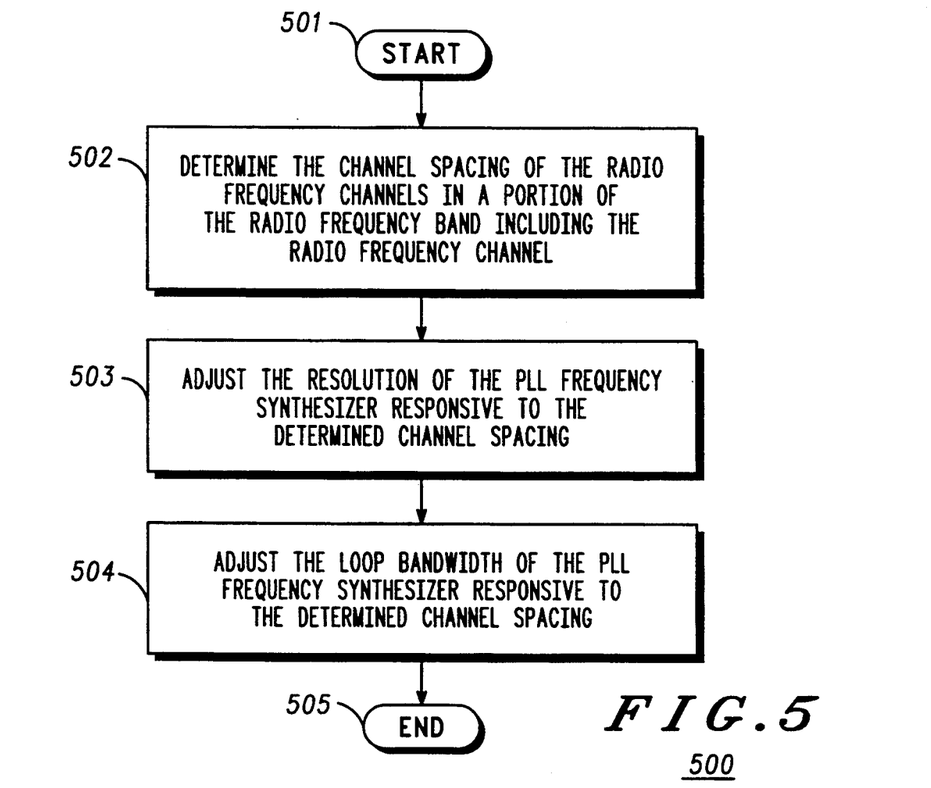
FIG. 5 illustrates a flowchart describing steps for controlling the resolution and bandwidth of the novel phase locked loop frequency synthesizer of FIG. 3 in accordance with the present invention.

FIG. 5 illustrates a flowchart describing steps for controlling the resolution and bandwidth of the novel phase locked loop frequency synthesizer of FIG. 3 in accordance with the present invention. The flowchart starts at step 501. At step 502, the transceiver 100 determines the channel spacing of the radio frequency channels in a portion of the radio frequency band including the radio frequency channel. At step 503, the transceiver 100 adjusts the resolution of the PLL frequency synthesizer 300 responsive to the determined channel spacing. At step 504, the transceiver 100 adjusts the loop bandwidth of the PLL frequency synthesizer 300 responsive to the determined channel spacing.

In contrast to the prior art, the PLL frequency synthesizer 300 can be used in a multi-mode transceiver 100 that can operate in either the GSM cellular system or the NAMPS cellular system, even though the channel spacings and lock time requirements are vastly different. This new requirement for a transceiver 100 capable of multi-mode functionality is advantageously realized by controlling the PLL frequency synthesizer 300 in response to the radio frequency channel spacing.

Figure 6:
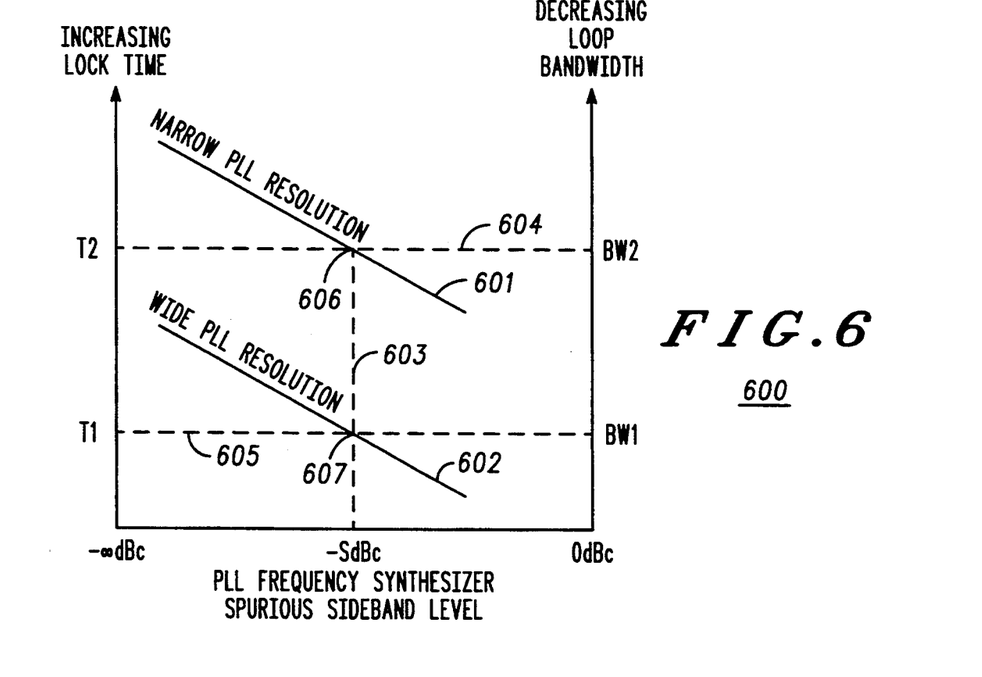
FIG. 6 illustrates a graph depicting a relationship between the spurious sideband level, lock time, loop bandwidth, and resolution in the novel phase locked loop frequency synthesizer of FIG. 3 in accordance with the present invention.

FIG. 6 illustrates a graph depicting a relationship between the spurious sideband level, lock time, loop bandwidth, and resolution in the novel phase locked loop frequency synthesizer of FIG. 3 in accordance with the present invention. FIG. 6 illustrates the advantage in terms of lock time resulting from a change in the resolution and loop bandwidth of the PLL frequency synthesizer 300 in FIG. 3.

The leftmost Y-axis in FIG. 6 represents lock time and is labeled with lock times T1 and T2. The rightmost Y-axis represents loop bandwidth and is labeled with loop bandwidths BW2 and BW1. Lock time in a the PLL frequency synthesizer 300 is inversely proportional to loop bandwidth, therefore line 604 is drawn between loop bandwidth BW2 and the corresponding lock time T2. Similarly, line 605 is drawn between loop bandwidth BW1 and the corresponding lock time T1. The X-axis represents the spurious sideband level at the output 116 or 117 of PLL frequency synthesizer 300 in units of decibels relative to the carrier level (dBc).

Curve 601 in FIG. 6 represents a narrow PLL resolution and gives an approximate relationship between the spurious sideband level at the output of PLL frequency synthesizer 108 or 109 and the loop bandwidth. Curve 602 represents a wide PLL resolution and gives an approximate relationship between the spurious sideband level at the output 116 or 117 of PLL frequency synthesizer 300 and the loop bandwidth. Curve 601 and line 604 intersect at point 606. Curve 602 and line 605 intersect at point 607. Line 603 is drawn between the intersection point 606 and the intersection point 607 and intersects the X-axis at a spurious sideband level of $-S$ dBc. The spurious sideband level of $-S$ dBc represents the transceiver spurious requirements as dictated by the system specifications or requirements, for example, of alternate channel selectivity. Therefore, lock time T2 is the best that can be achieved using a narrow resolution for the spurious sideband level $-S$ dBc. The improved lock time T1 can be achieved, at no degradation in spurious sidebands from $-S$ dBc, by controlling the PLL frequency synthesizer 300 in such a manner so as to produce a wide resolution and increased loop bandwidth BW1 based on a determination of a wide channel spacing on the radio frequency channel.

Thus, the present invention provides an apparatus and method for operating a phase locked loop frequency synthesizer responsive to radio frequency channel spacing. The present invention advantageously provides faster lock time and lower noise from the PLL frequency synthesizer 300. This advantage and others are generally provided by an apparatus and method performing the steps of determining the channel spacing of the radio frequency channels in a portion of the radio frequency band including the radio frequency channel, and controlling the PLL frequency synthesizer 300 responsive to the determined channel spacing. With the present invention the prior art problems of generating noise and spurious sidebands and missing information due to the slow lock time of a PLL frequency synthesizer are substantially resolved.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. In a radio frequency transceiver operating in a radio frequency band including a plurality of radio frequency channels, wherein channel spacing is defined as a difference in frequency between two adjacent channels of the radio frequency band, wherein the channel spacing varies over the radio frequency band, wherein the radio frequency transceiver includes a phase locked loop (PLL) frequency synthesizer operative to tune the radio frequency transceiver to a radio frequency channel in the radio frequency band and operative to generate an output frequency signal, wherein the PLL frequency synthesizer has an adjustable loop bandwidth, a method for operating the PLL frequency synthesizer comprising the steps of:
   determining the channel spacing of the radio frequency channels in a portion of the radio frequency band including the radio frequency channel; and
   adjusting the loop bandwidth of the PLL frequency synthesizer responsive to the determined channel spacing.

2. A method according to claim 1 further comprising the step of operating the PLL frequency synthesizer in continuous and discontinuous modes responsive to first and second determined channel spacings, respectively.

3. A method according to claim 2 wherein the first determined channel spacing is less than the second determined channel spacing.

4. A method according to claim 2 further comprising the step of:
   adjusting the resolution of the PLL frequency synthesizer responsive to the first and second determined channel spacings, wherein the resolution is defined by a minimum allowable change in the frequency of the output frequency signal.

5. A method according to claim 1 further comprising the step of:
   adjusting the resolution of the PLL frequency synthesizer responsive to the determined channel spacing, wherein the resolution is defined by a minimum allowable change in the frequency of the output frequency signal.

6. In a radio frequency transceiver operating in a radio frequency band including a plurality of radio frequency channels, wherein channel spacing is defined as a difference in frequency between two adjacent channels of the radio frequency band, wherein the channel spacing varies over the radio frequency band, wherein the radio frequency transceiver includes a phase locked loop (PLL) frequency synthesizer operative to tune the radio frequency transceiver to a radio frequency channel in the radio frequency band and operative to generate an output frequency signal, wherein the PLL frequency synthesizer has an adjustable loop bandwidth, an apparatus for operating the PLL frequency synthesizer comprising:
   a processor operative to determine the channel spacing of the radio frequency channels in a portion of the radio frequency band including the radio frequency channel; and operative to adjust the loop bandwidth of the PLL frequency synthesizer responsive to the determined channel spacing.

* * * * *